June 24, 1958 W. B. GUGGI 2,840,727
SELF-LOCKING TRANSISTOR SWITCHING CIRCUIT
Filed March 27, 1956
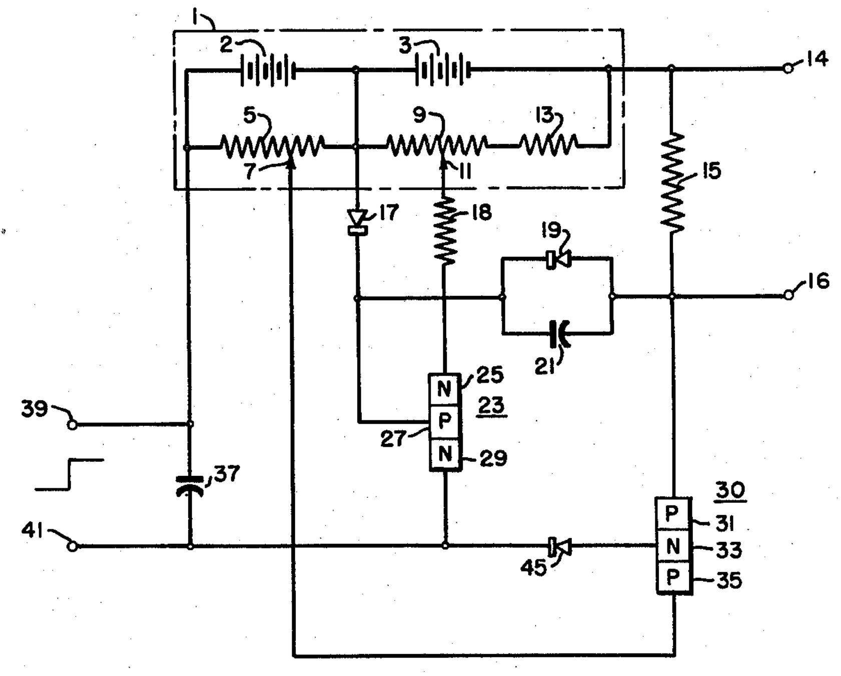
WITNESSES:
Bernard R. Giegucz
Leon J. Taga
INVENTOR
Walter B. Guggi
BY John B. Davidson
ATTORNEY United States Patent Office 2,840,727

Patented June 24, 1958

2,840,727

SELF-LOCKING TRANSISTOR SWITCHING CIRCUIT

Walter B. Guggi, Palo Alto, Calif., assignor to Westinghouse Electric Corporation, East Pittsburgh, Pa., a corporation of Pennsylvania Application March 27, 1956, Serial No. 574,174

5 Claims. (Cl. 307—88.5)

This invention relates to electrical trigger circuits and, more particularly, to electrical circuits utilizing transistors wherein conduction through a transistor is inaugurated a predetermined time after reception of an electrical signal thereby, or is triggered upon receiving an electrical signal of predetermined minimum magnitude.

It has been previously known to use transistors of opposite conductivity types in a free running multivibrator wherein the emitter to collector voltage of each of the transistors is applied between emitter and base of the other transistor to render the two transistors into the same conduction state. A capacitor is provided for a positive feedback path from the output transistor to the other transistor to provide a cyclically operating on-off oscillatory circuit. Such a device is described in the copending application of Richard L. Bright entitled "Adjustable Multivibrator," Serial No. 439,297, filed June 25, 1954, now Patent No. 2,788,449, and assigned to the assignee of the present invention. While the multivibrator described therein is perfectly satisfactory for the application for which it was designed, it is essentially an astable device and will not provide selectively bistable operation. Furthermore, it is not particularly feasible to use transistors having different semiconductive materials in the circuit, and it is often desirable to use transistors of such a nature. Additionally, the timing characteristic of the circuit varies with changes in applied bias voltages, which characteristic may not be particularly desirable for many purposes.

One object of this invention is to provide a timing trigger circuit for producing an output signal a predetermined, adjustable time after application of an input signal thereto.

Another object is to provide a bistable trigger circuit utilizing transistors wherein transistors formed of different semiconductive materials may be utilized without deleterious effects.

Still another object is to provide a timing trigger circuit which is essentially independent of voltage variations insofar as its timing characteristic is concerned.

Yet another object is to provide a bistable trigger circuit for producing an output signal upon receiving an input signal, whenever the magnitude of the input signal reaches a given magnitude.

Other objects and features of the present invention will become apparent upon consideration of the following detailed description when taken in connection with the single figure of the accompanying drawing which illustrates a preferred embodiment of the invention. It is to be expressly understood, however, that the drawing is designed for purposes of illustration only and not as a definition of the limits of the invention.

Referring now to the drawing, there is shown transistors 23 and 30 of opposite conductivity types, transistor 23 being depicted as of the NPN type and transistor 30 of the PNP type. With suitable changes in the bias voltages and polarity senses of the circuit components hereinafter described, the conductivity types of the transistors may be reversed from that shown in the drawing. A bias source 1 is provided for transistors 23 and 30, which bias source includes potential sources 2 and 3 (which may be either batteries or a regulated voltage power supply) with potentiometer 5 connected across potential source 2 and serially connected potentiometer 9 and resistor 13 connected across potential source 3. The negative terminal of source 2 is connected to the positive terminal of source 3. The collector terminal 31 of transistor 30 is coupled to the negative terminal of source 3 through output impedance 15 to which output impedance are connected output terminals 14 and 16. Emitter 35 of transistor 30 is connected to the tap 7 of potentiometer 5. Base electrode 33 of transistor 30 and collector electrode 29 of transistor 23 are coupled together by means of half-wave rectifier 45, the purpose of which rectifier is to minimize leakage current between said transistors such as will occur when transistor 30 is (of silicon and) of germanium semiconductive materials. The leakage current with temperature is higher for germanium so that the voltage variation between collector 29 and base 33 resulting thereby through the circuitry herein described will cause deleterious effects on the circuit operation as described hereinafter. Preferably rectifier 45 is of silicon so as to have a very low leakage with temperature variations. Bias for transistor 23 is provided by means of rectifier 17 which is connected between the juncture of potentiometers 5 and 9 and base 27 with the cathode thereof connected to base 27. Resistor 18 coupling emitter 25 of transistor 23 to tap 11 of potentiometer 9 is for the purpose of effectively converting transistor 23 to a grounded base configuration, which configuration will more nearly make the circuit independent of variations of supply voltage.

A capacitor 37 is connected between the positive terminal of potential source 2 and the collector 29 of transistor 23, which capacitor is for the purpose of restricting the rate of change of emitter to collector bias on transistor 23. For certain applications, stray interelectrode and wiring capacitances may provide sufficient capacitance to enable elimination of capacitor 37. Control terminals 39 and 41 are connected to the terminals of capacitor 37 to which may be coupled a controllably variable resistance device such as a transistor, photodiode, transducer, or relay.

A positive feedback circuit from the collector 31 of transistor 30 to base 27 of transistor 23 is provided by parallel connected capacitor 21 and half-wave rectifier 19, the cathode of rectifier 19 being connected to base 27. The function of capacitor 21 is to feed a signal from collector 31 to base 27 that will drive transistor 23 to saturation or to cutoff depending on the sense of change of voltage at collector 31. Rectifier 19 is for the purpose of holding transistor 23 in the conduction state of transistor 30.

The bias on transistor 23 provided by potentiometer 9 is adjusted so that transistor 23 operates in the region of its collector current vs. emitter to collector voltage characteristic, whereat the collector current is substantially constant with variation in the voltage appearing between emitter and collector. Capacitor 37 is thus charged through a current conduction circuit including the emitter to collector current conduction path of transistor 23, resistor 18, the portion of potentiometer 9 between tap 11 and the juncture of potentiometers 5 and 9, and potential source 2.

The operation of the circuit described above is as follows. Assume that the circuit is in a stable "on" position providing an output voltage across output impedance 15. Base 33 is negative with respect to emitter 35 by virtue of the positive bias on emitter 35 provided by potentiometer 5; therefore, transistor 30 is conducting. The positive bias on collector 31 with respect to point 11 on potentiometer 9 is applied to base 27 through rectifier 19 to render transistor 23 conducting. Collector 31 is positive with respect to base 27 if the tap 7 of potentiometer 5 is adjusted properly to compensate for the voltage drop across transistor 30. Assume now that capacitor 37 is short-circuited by the control device connected to terminals 39, 41. Base 33 will be driven positive with respect to emitter 35 by the voltage between tap 7 and terminal 39 to diminish current conduction through transistor 30 and drop the voltage across resistor 15. Capacitor 21 will couple the voltage surge at collector 31 to base 27 and the collector current through transistor 23 will, therefore, sharply diminish. In effect, the negative voltage surge on base 27 is amplified, reversed and fed back to base 33, thus further decreasing the current conduction through transistor 30 until current flow therethrough ceases completely, causing the output voltage across output impedance 15 to disappear. It has been found that even for very slow and small change in input voltage across terminals 39, 41, the circuit effects a snap action upon approaching a critical switching voltage.

When the short circuit is removed from capacitor 37, the capacitor will charge through the charging path described above. The capacitor will charge at a constant, predetermined rate until base 33 approaches a negative value with respect to emitter 35, so as to bring about current conduction through transistor 30. A voltage will appear across output impedance 15 and between base 33 and collector 31. This voltage will be applied to base 27 of transistor 23, amplified, reversed and applied to base 33 to further increase current conduction through transistor 30. The circuit will thereupon snap into a conducting condition and provide an output voltage across resistor 15 that is essentially a step function.

The position of tap 7 of potentiometer 5 determines the charging voltage on capacitor 37 at which the switching action takes place. Normally, tap 7 should be set as close as possible to the junction of potentiometers 5 and 9 in order to take advantage of the full charging rate; however, the position of the tap will serve as a time selector since its position is a linear function of time for all practical purposes.

The grounded base configuration described above for transistor 23 is advantageous in that it helps to compensate for timing changes due to voltage variations. The grounded base circuit provides a proportional constant current change as a function of supply voltage change and, therefore, decreases the timing cycle with increasing voltage and vice versa. Further, an increasing voltage across also proportionally increases the timing cycle due to the increased voltage across timing capacitor 37 and, therefore, compensates for the time decrease caused by the increase of constant current in transistor 23. Therefore, the circuit should approach 100% compensation for any voltage change if transistor 23 is connected in the grounded base configuration.

Note that rectifier 17, in addition to coupling the bias provided by potentiometer 9 to the base 27 of transistor 23, also prevents a short circuit between collector 31 and the juncture of potentiometers 5 and 9 when transistor 30 is conducting. Note further that silicon rectifier 45 isolates base 33 from capacitor 37 during the charging cycle of the capacitor and still provides conduction at the end of the charging cycle so that the timing circuit is unloaded for all practical purposes and the charging rate of the capacitor is linear as a function of time. Further, the leakage current mentioned above would result if transistor 30 is of germanium semiconductive material and would charge capacitor 37. Rectifier 45 effectively counteracts this phenomenon.

The following typical values of circuit constants were found to be effective in the circuit described above:

| | |
|---|---|
| Capacitor 37 | A $\mu$f. |
| Capacitor 21 | .1 $\mu$f. may vary considerably depending on switching time desired. |
| Diode 17 | 1N191. |
| Diode 19 | 1N191. |
| Diode 45 | Silicon diode. |
| Transistor 23 | Texas Instr. 952. |
| Transistor 30 | 2N44. |
| Potentiometer 5 | 1K carbon. |
| Potentiometer 9 | 1K carbon. |
| Resistor 13 | 2K carbon. |
| Resistor 15 | 10K carbon. |
| Resistor 18 | 50K wire wound. |

While the embodiment disclosed in the preceding specification is preferred, other modifications will be apparent to those skilled in the art which do not depart from the scope of the broadest aspects of the present invention.

I claim as my invention:

1. In a trigger circuit responsive to a signal voltage at first and second signal input terminals thereof, the combination of first and second junction transistor devices of opposite conductivity types, with each transistor device including emitter, base and collector electrodes; a first bias voltage source having a plurality of terminals, and a second bias voltage source having a plurality of terminals, with one terminal of the first bias voltage source being connected to the emitter of said second transistor device; output impedance means connecting the collector of said second transistor device to one terminal of said second bias voltage source; capacitor means coupling a second terminal of said first bias voltage source to the collector of said first transistor means; said capacitor means being connected between said first and second input terminals; positive feedback means coupling the collector of said second transistor device to the base of said first transistor device and including parallel connected capacitor and first half-wave rectifier means, said first half-wave rectifier means being connected to maintain said first transistor device in the same conduction state as said second transistor device; with a third terminal of the first bias voltage source being connected in a common junction with a second terminal of the second bias voltage source; second half-wave rectifier means coupling said common junction to the base electrode of said first transistor device; resistance means connecting the emitter electrode of said first transistor device to a third terminal of the second bias voltage source; said second half-wave rectifier means being poled to normally bias said first transistor device to conduction by virtue of the voltage between the latter said third terminal and a common junction between said rectifier means; third half-wave rectifier means coupling the base electrode of said second transistor device to the collector electrode of said first transistor device and adapted to block leakage current from the emitter-to-base current conduction path of said second transistor device.

2. A trigger circuit responsive to a signal voltage at first and second signal input terminals thereof, comprising: first and second junction transistor devices of opposite conductivity types, with each transistor device including emitter, base and collector electrodes; bias voltage source means having a plurality of terminals and being operative with said transistor devices and including first and second potentiometer means respectively coupled across first and second potential sources, said first and second potentiometer means respectively having first and second taps for providing bias voltages, said first and second potentiometer means being series connected; said first tap being connected to the emitter of said second transistor device; output impedance means connecting the collector of said second transistor device to one terminal of said bias voltage source means; capacitor means coupling a second terminal of said bias source means to said collector of said first transistor device; said capacitor means being connected betwe:n said first and second input terminals; positive feedback means coupling the collector of said second transistor device to the base of said first transistor device and including parallel connected capacitor and first half-wave rectifier means, said first half-wave rectifier means being connected to maintain said first transistor devices in the same conduction state as said second transistor device; second half-wave rectifier means coupling the juncture of said potentiometer means to the base electrode of said first transistor device; resistance means connecting the emitter electrode of said first transistor device to said second tap; said second half-wave rectifier means being poled to normally bias said first transistor device to conduction by virtue of the voltage between said second tap and the juncture of said rectifier means; with the base electrode of said second transistor device being coupled to the collector electrode of said first transistor device.

3. A trigger circuit responsive to a signal voltage at first and second signal input terminals thereof, comprising; first and second junction transistor means of opposite conductivity types, each including emitter, base and collector electrodes; bias voltage source means including a plurality of terminals and being operative with said transistor means and including first and second potentiometer means respectively coupled across first and second potential sources, said first and second potentiometer means respectively having first and second taps for providing bias voltages, said potentiometer means being series connected; said first tap being connected to the emitter of said second transistor means; output impedance means connecting the collector of said second transistor means to one terminal of said bias voltage source means; said input terminals being connected respectively to a second terminal of said bias voltage source and to the collector of said first transistor means; positive feedback means including rate feedback means for coupling the collector of said second transistor means to the base of said first transistor means and including parallel connected capacitor and first half-wave rectifier means, said first half-wave rectifier means being connected to maintain said first transistor means in the same conduction state as said second transistor means; second half-wave rectifier means coupling the juncture of said potentiometer means to the base electrode of said first transistor means; resistance means connecting the emitter electrode of said first transistor means to said second tap; said second half-wave rectifier means being poled to normally bias said first transistor means to conduction by virtue of the voltage between said second tap and a juncture provided between said rectifier means; third half-wave rectifier means coupling the base electrode of said second transistor means to the collector electrode of said first transistor means and adapted to block leakage current from the emitter-to-base current conduction path of said second transistor means.

4. A trigger circuit responsive to a signal voltage applied between first and second signal input terminals thereof, comprising; first and second junction transistor devices of opposite conductivity types, each transistor device including emitter, base and collector electrodes; bias voltage source means including a plurality of terminals and being operative with said transistor devices and further including first and second tapped resistance means respectively coupled across first and second potential sources, said first and second tapped resistance means respectively having first and second taps for providing bias voltages; said first and second tapped resistance means being series connected; said first tap being connected to the emitter of said second transistor device; output impedance means collecting the collector of said second transistor device to o:.: terminal of said bias voltage source means; capacitor means coupling a second terminal of said bias voltage means to the collector of said first transistor device; said capacitor means being connected between said input terminals, positive rate feedback means coupling the collector of said second transistor device to said base of said first transistor device and including parallel connected capacitor and first half-wave rectifier means, said first half-wave rectifier means being connected to maintain said first transistor device in the same conduction state as said second transistor device; second half-wave rectifier means coupling a provided juncture between said tapped resistance means to the base electrode of said first transistor device; resistance means connecting the emitter electrode of said first transistor device to said second tap; said second half-wave rectifier means being poled to normally bias said first transistor device to conduction by virtue of the voltage between said second tap and a provided juncture between said rectifier means; third half-wave rectifier means coupling the base electrode of said second transistor device to the collector electrode of said first transistor device and adapted to block leakage current from the emitter-to-base current conduction path of said second transistor device.

5. A trigger circuit responsive to a signal voltage at first and second signal input terminals thereof, comprising: first and second junction transistor means of opposite conductivity types, each including emitter, base and collector electrodes; bias voltage source means having a plurality of terminals and being operative with said transistor means and including first and second potentiometer means respectively coupled across first and second potential sources, said first and second potentiometer means respectively having first and second taps for providing bias voltages, said potentiometer means being series connected at a common junction; said first tap being connected to the emitter of said second transistor means; output impedance means connecting the collector of said second transistor means to one terminal of said bias voltage source means; capacitor means coupling a second terminal of said bias voltage source means to the collector of said first transistor means; said capacitor means being connected between said input terminals; positive feedback means coupling the collector of said second transistor means to the base of said first transistor means and including a parallel connected capacitor and first half-wave rectifier means, said first half-wave rectifier means being operatively connected to maintain said first transistor means in the same conduction state as said second transistor means; second half-wave rectifier means coupling said junction between said potentiometer means to the base electrode of said first transistor means; with the emitter electrode of the first transistor means being connected to said second tap; said second half-wave rectifier means being poled to normally bias said first transistor means to conduction by virtue of the voltage between said second tap and a provided juncture between said rectifier means; third half-wave rectifier means coupling the base electrode of said second transistor means to the collector electrode of said first transistor means and being adapted to block leakage current from the emitter-to-base current conduction path of said second transistor means.

References Cited in the file of this patent

UNITED STATES PATENTS 2,655,609 Shockley ______________ Oct. 13, 1953